United States Patent [19]

Myers

[11] Patent Number: 4,520,327
[45] Date of Patent: May 28, 1985

[54] OSCILLATOR HAVING MANUAL AND AUTOMATIC FREQUENCY CONTROL

[76] Inventor: Roland Myers, 33 Withenfield Rd., Manchester M23 9BT, England

[21] Appl. No.: 388,630

[22] Filed: Jun. 15, 1982

[30] Foreign Application Priority Data

Jun. 16, 1981 [GB] United Kingdom ................. 8118398
Dec. 14, 1981 [GB] United Kingdom ................. 8137591

[51] Int. Cl.³ .............................................. H03L 7/00
[52] U.S. Cl. ................................ 331/177 R; 331/1 R; 331/25; 331/34
[58] Field of Search ................... 331/1 R, 1 A, 25, 34, 331/177 R

[56] References Cited

U.S. PATENT DOCUMENTS

3,484,712 12/1969 Foote et al. .................... 331/1 A
3,753,141  8/1973 Van Elk et al. ................. 331/1 A
3,806,825  4/1974 Schlosser ....................... 331/1 A
4,031,483  6/1977 Formeister ..................... 331/17

Primary Examiner—Eugene R. LaRoche
Assistant Examiner—Robert J. Pascal
Attorney, Agent, or Firm—Fiddler & Levine

[57] ABSTRACT

A variable frequency oscillator 10 has an output frequency Fo responsive to a voltage input Vo derived from an analogue integrator 11 controlled by potentiometer 15, 16, the frequency Fo being displayed on frequency meter 19 having a ghost least significant digit. A converter 24 responds to the digit of a digital output fed to a digital to analogue converter 20 providing an error voltage Ve whose magnitude is proportional to the deviation of the digit from a datum, e.g. 5, and whose polarity depends on whether the deviation is + or −. The voltage Ve is also fed to the integrator 11 to control the voltage Vo.

An arrangement is also described in which the voltage Ve is derived from the divider chain of a gate period generator controlling a frequency counter whose input is Fo.

15 Claims, 2 Drawing Figures

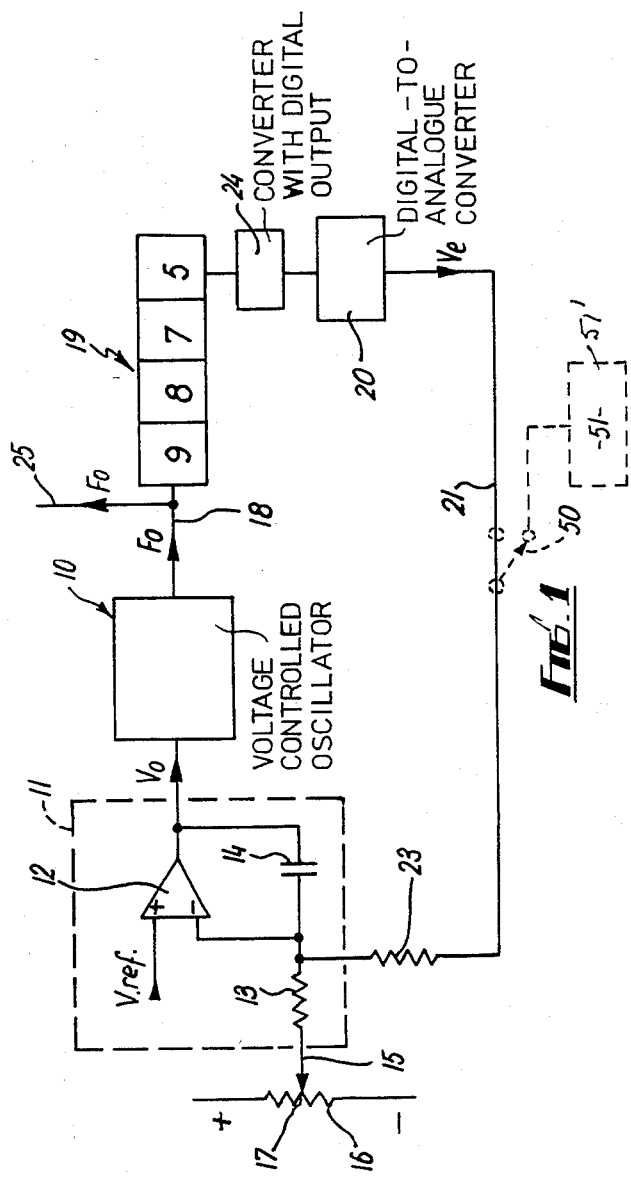

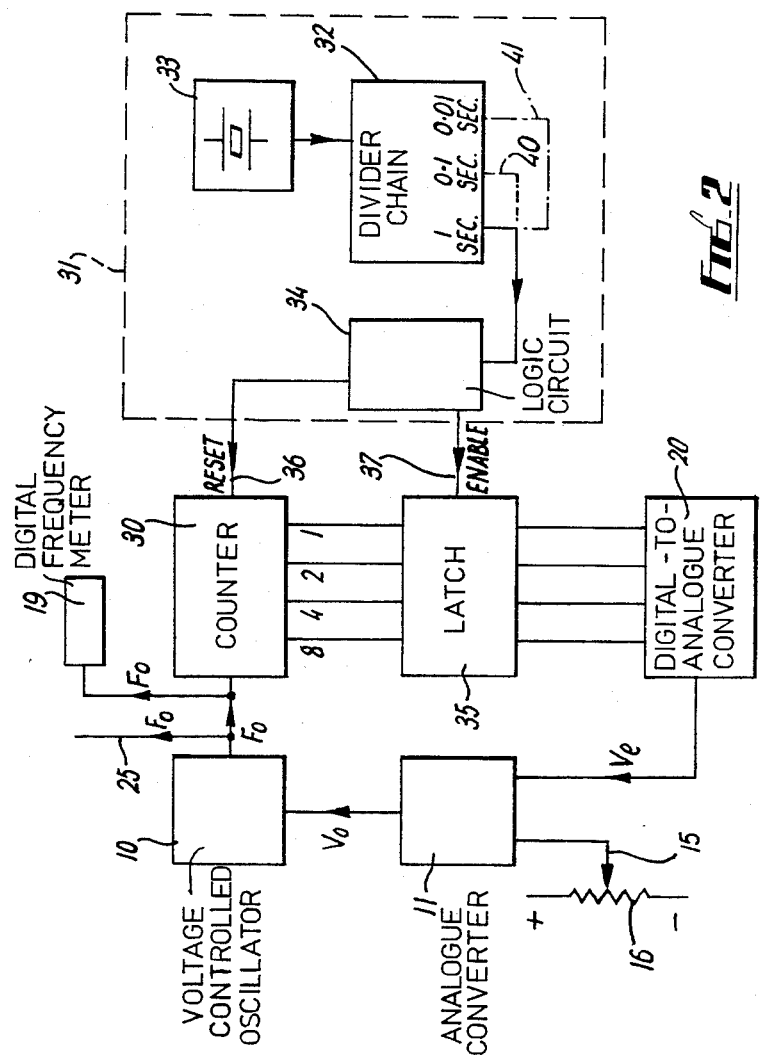

OSCILLATOR HAVING MANUAL AND AUTOMATIC FREQUENCY CONTROL

This invention relates to oscillators, and in particular to electronic oscillators having a variable frequency output.

It is known that oscillators whose frequency output is dependent on a voltage input are subject to drift due to varying ambient conditions and other factors, and components and circuits associated with them are also subject to similar changes and the present invention has been made from a consideration of this.

According to this invention, an oscillator system comprises first means responsive to a first input control voltage for providing an output voltage, the rate of change of the output voltage being dependent on the difference between the first input control voltage and a reference voltage, an oscillator for providing an output signal whose frequency is responsive to a voltage input derived from said output voltage, and second means for providing a second input control voltage to the first responsive means, the rate of change of said output voltage being also dependent on the second input control voltage.

The first responsive means may comprise an analogue integrator.

There may be a potentiometer for providing the first input control voltage.

The potentiometer may be manually adjustable to vary the frequency of said output signal.

The second means may comprise means for sensing deviation from the desired frequency, said second input control voltage being dependent on the sensed deviation.

The sensing means may comprise means for counting the cycles of said output signal in a predetermined period.

The sensing means may comprise a digital frequency meter having at least one digit for said deviation, and a digital-to-analogue converter for providing said second input control voltage in response to the deviation. Said one digit can be any one of the ten integers 0 to 9, and said deviation is from a reference digit which is one of the ten integers.

The digital frequency meter may be arranged to display the frequency output to a desired number of digits.

The sensing means may comprise a counter arranged repeatedly to count for a predetermined period, a count at the end of said period being fed to a digital-to-analogue converter for providing said second input control in response to the deviation.

The predetermined period may be determined by a gate period generator.

Means may be provided for varying the predetermined period. For example the gate period generator may comprise a divider chain with means for varying the effective length of the chain to vary the gate period.

The count may be stored in a latch, the latched count being updated at the end of each gate period. The deviation may be from a reference being the least significant integer in a frequency counter.

The oscillator system may include an FM detector providing said second input control voltage dependent on deviation between the frequency of an input signal to the detector and the center frequency of the detector passband.

The invention also provides a radio receiver including as a local oscillator an oscillator system as defined above.

The invention may be performed in various ways and two specific embodiments with possible modifications will now be described by way of example with reference to the accompanying drawings in which:

FIG. 1 shows an oscillator stabilized by reference to the least significant digit of a frequency display meter; and FIG. 2 shows an oscillator stabilized by reference to the least significant digit of a frequency counter.

Referring to FIG. 1 the output frequency Fo of a voltage controlled variable frequency oscillator 10 (VCO) is adjusted by varying the voltage input Vo. The voltage input Vo in the present case is obtained from an analogue integrator 11 comprising an operational amplifier 12 having a fixed voltage input Vref, resistor 13 and capacitor 14. The operator may adjust or vary the rate of change of the output voltage Vo of the analogue integrator 11 by varying the position of a control member 15 of a potentiometer having resistor 16. The rate of change of Vo is directly proportional to the voltage difference between member 15 and Vref. The rate of change of Vo is, therefore, proportional to the input control voltage on member 15. The potentiometer resistor 16 is fed by fixed voltages such that at the center position 17 the voltage on the control member 15 is equal to Vref. The voltages at the extreme ends of the potentiometer are respectively more positive and more negative than Vref. In the position shown, the control member 15 is at a zero or null position 17 of the potentiometer resistor 16 and the voltage output of the integrator is nominally unchanging. If the control member 15 is moved from the null point 17, the voltage output from the integrator 11 will increase or decrease at a rate dependent on the amount of displacement from the null point, Vo increasing if the control member voltage decreases with respect to Vref and vice-versa. The value of resistor 16 is preferably much greater than the value of resistor 13, for example 1 M ohm to 100 ohms, so that movement of control member 15 in the region of the null point 17 gives fine tuning, and movement of control member 15 near to an end of resistor 16 gives very rapid change of Vo. In some cases the output from the integrator may be fed to the oscillator through a resistor.

If the control member 15 is at the null point 17, the output voltage Vo should remain steady, giving a steady frequency output Fo from the oscillator 10. In practice, drift would occur through changes in ambient temperature and other factors. In the present arrangement, means are provided for correcting for this drift.

The output signal on line 18 from the oscillator 10 is fed to a digital frequency meter indicated at 19. In the present example, this is arranged to display the frequency Fo in kilohertz to three digits, for example 987 KHz as shown However, the meter is arranged to give a non-visible or ghost additional digit of resolution, reading 0.5 KHz in the case shown. The ghost digit information may be conveniently taken in a seven segment display driving form or, if there is total access to the frequency counter circuitry, the equivalent information may be taken from the divider chain inherently present in any such counter.

The frequency meter is connected to a converter 24 arranged to convert the ghost display to a convenient digital output which is fed to a digital to analogue converter 20 which thus responds to the non-visible digit to provide an error voltage output Ve in line 121 in proportion to the magnitude and polarity of the non-visible digit in relation to a reference digit, for example five, so that in the condition illustrated Ve is zero with respect to Vref.

The error signal Ve is fed through resistor 23 as an additional control input to the integrator 11.

The digital display 19 and converter 20 are arranged to produce zero error signal (Ve) with respect to Vref whenever the ghost digit reads 5. Should the final ghost digit read other than 5, a voltage Ve proportional in magnitude to and of the same polarity as the deviation from the reference (5) will be produced. This error voltage is fed through resistor 23 to the integrator input thus producing a correcting effect in proportion to the magnitude of the frequency error or difference from 5, the correcting effect being a rate of change of Vo.

By this means the system drives the final ghost digit towards a reading of 5 thus tending to obviate any inclination for the final visible digit to read other than the desired figure.

The resistor 23 is suitably proportioned to resistor 13 so that the feedback loop is only able to hold the system in lock when the control member 15 of the operator's potentiometer is sensibly close to the center or null position 17.

The relative magnitudes of resistors 13 and 23 would normally be ascertained empirically in the particular circuit conditions.

The converter 20 performs its conversion only on the least significant digit of the digital frequency counter 19, that digit normally being invisible to the user. When the information derived from this last digit is fed back into the system as shown, the next most significant digit exhibits a tendency to remain locked, and in a correctly functioning system will remain in the locked state until the operator's potentiometer has been positioned far enough from the center point 17 to overcome the locking effect of the feedback system.

When the system is in lock, the deviation of the last (ghost) digit from the count of 5 gives a measure of the degree of drift for which the locking system is compensating.

The use of only a single ghost digit offers four correction steps of one polarity and five of the other, and this will be satisfactory for many applications. The ghost digits may be extended to two or more in the same way that the visible portion of the display may contain more digits, the particular application dictating the accuracy required.

It will be understood that Fo may change from a desired value because of a change in Vo, for example due to drift, and/or because of drift within the oscillator. For example, Fo may increase slightly. The last or ghost digit then changes to 6, then perhaps 7, then perhaps 8, the correction voltage Ve increasing correspondingly thus reducing Vo to return Fo to the desired value at which time Vo will have returned to the initial value corresponding to the desired value of Fo, i.e. 987 in the case shown, the visible digits not having changed.

In order to adjust the frequency Fo, the operator moves the control member 15 away from the null point 17 to an extent to overcome the feedback correction; and the frequency Fo then changes, as mentioned above. When the desired frequency is reached, the operator moves the control member 15 back to the null point 17 to hold the frequency Fo steady, the new frequency being shown by the visible digits.

This tuning system may for example be applied in a radio receiver having a superheterodyne arrangement. The frequency Fo would be used at the heterodyne frequency, and would be available for example on line 25.

The operator would be able to control the rate at which the frequency spectrum is scanned by the displacement of the potentiometer from the center position, the greater the displacement the greater the rate of change of frequency. Returning the potentiometer to the center position results in zero (nominally) rate of change of frequency, thus allowing a particular frequency Fo to be held by the action of the feedback signal Ve.

It will thus be understood that the voltage Vo changes to correct for undesired changes to Fo and Ve is zero when Fo is at the desired frequency. This has advantages if the oscillator 10 is used as a local oscillator in a radio receiver 51'. In this case, as shown dotted in FIG. 1, a switch 50 may be included in line 21 so that the resistor 23 may receive either Ve from converter 20, as above; or may receive a voltage from FM detector 51 forming part of the receiver. This voltage in known manner is +Ve or −Ve with respect to Vref dependent on whether the received signal departs from the center of the receiver/detector passband. The desired frequency is the frequency which maintains the received signal in the center of the receiver's passband. The received signal may depart from the center of the receiver's passband due to drift of the receiver oscillator and/or because the transmitted signal slowly drifts. In either case the error voltage from the detector will be supplied to resistor 23 to change Vo to re-center the passband on the received signal.

This provides automatic frequency control (AFC) but, unlike conventional AFC systems, the receiver tracks or follows changes in the frequency of the received signal and thus if switch 50 were opened the receiver would, at least initially, remain on the frequency of the received signal. This facility is also available with the arrangement of FIG. 2.

As mentioned above, the same error correction voltage may be derived from the frequency counter divider chain, and it is possible to construct a quite separate divider chain expressly for the purpose of producing an error correction signal. The separate divider and associated circuitry could operate in conjunction with a frequency count/display system, possibly sharing common circuitry such as a gate period generator, or be a quite independent arrangement. An outline independent system for producing a correction voltage, operating on the same "ghost digit" principle but using frequency counter circuitry modified for the purpose, is shown in FIG. 2.

A divide by ten input counter 30 must be of a type which is able to count through zero without limitation (7, 8, 9, 0, 1, 2, 3, 4, 5, 6 . . . etc).

A gate period generator 31 is itself a divider chain 32 driven for example by a quartz crystal oscillator 33 to ensure extreme accuracy of the gate period. The function of the generator 31 is to provide a reference time interval during which the input signal frequency Fo will be counted.

A safety logic circuit 34 receiving the output signal from chain 32 ensures that at the end of the gate period, the count in the input counter 30 has been transferred to a 4-bit latch 35 by a signal on line 37 before the input counter 30 is reset to zero and the count process started again by a signal on line 36.

If the frequency Fo to be counted were for example 5.000002 MHz (5 million and 2 Hertz), and the gate period were 1 second, then the input counter 30 (having been reset to zero prior to the gate period) would count through the ten units 0 to 9 500,000 times and would have reached integer 2 on the 500,001 counting cycle at the end of the 1 second gate period. The binary count decimal outputs 1, 2, 4, 8 would thus be at level low, high, low, low respectively, indicating a count of 2. This is transferred to the latch 35, by a signal on line 37 just prior to a reset signal on line 36. At the end of the next succeeding gate period, the next enable signal on line 37 updates the latched count and thus the error signal Ve.

If the input frequency were 5.000005 MHz (5 million and 5 Hz) the input counter 30 would have just reached the final count of 5 at the end of the 1 second gate period. If this count is latched and then digital to analogue converted in converter 20, the resultant output voltage Ve represents an error signal which may be fed back to the integrator 11 controlling the voltage controlled oscillator 10 resulting in a frequency locking effect.

Due to the latch 35, the output error voltage Ve remains at a fixed level while the next count period is taking place, the new level being latched in at the end of each gate period.

If the converter 20 is arranged to produce an error voltage Ve equal to the integrator Vref whenever the latch holds a count of 5, the result is that the oscillator 10 remains locked provided that the drift from all sources does not exceed +4 or −5 counts per gate period (1 second in this example).

In this example, the voltage controlled oscillator 10 will lock every 10 Hz (i.e. 5.000005; 5.000015; 5.000025 MHz) i.e. a resolution of 10 Hz.

It should be noted that while the example shows a divide by ten device 30 as the input counter, this could be extended to divide by 100 to provide a greater number of correction steps, the latch 35 and converter 20 being similarly extended. The denary counting system is chosen as it is the normal human counting base, but the input counter 30 could equally well count to some binary base such as divide by 16, or indeed whichever counting base is most suitable.

In each case, the basic resolution of the feedback control system is governed by the gate period over which the input counter is allowed to function before transferring the count to the latch. In the example given, the least significant bit of the input counter represents a count of 1 Hz. If the gate period were shortened to 0.1 second through connector 40 shown chain dotted, the least significant bit of the input counter (i.e. output line 1) would represent a count of 10 Hz, and the system would lock every 100 Hz (i.e. 5.000,050; 5.000150; 5.000250 MHz). The gate period could for example be adjusted to other values, for example 0.01 second as indicated at 41.

In this manner, the basic resolution and number of steps of correction may be tailored to suit the particular application of the stabilized oscillator 10.

The signal Fo could be displayed at a digital frequency meter 19.

In effect the counting and frequency control arrangement of FIG. 2 is a single integer counter—similar to the least significant integer of the frequency counter/display 19 of FIG. 1.

It will be understood that the voltage Vo whose rate of change depends on the difference between an input voltage and a reference voltage can be obtained by other means, for example using digital means providing stepped changes in Vo but the stepless or continuous change provided by analogue converter 11 is preferred.

The system is designed so that the drift to be expected under normal working conditions can be compensated by the error signal Ve derived within the limits provided by the non-visible digit or digits, the particular selected visible desired frequency remaining unchanged until a new frequency is selected by the operator.

The system is also designed so that the rate of change of Vo when the maximum +Ve or −Ve limit of Ve (ghost digit 9 or 0) is applied to the integrator via resistor 23 is approximately equal and opposite to the rate of drift from all sources to be expected under worst case conditions.

I claim:

1. An oscillator system comprising an oscillator having an input for receiving an input voltage, the oscillator providing an output signal whose frequency is responsive to the input voltage, means for deriving from the output signal, the frequency of which is considered as represented in digital form, a control voltage dependent on the difference between only a lower part of the output signal and a predetermined lower part, said predetermined lower part comprising the lowermost digit represented by the output signal, said control voltage arranged for varying said input voltage, and means for varying the input voltage.

2. An oscillator system as claimed in claim 1, in which the means for varying the input voltage comprises an analogue integrator having a first input and a second input, said control voltage being applied to said first input, and means for supplying a tuning voltage to said second input.

3. An oscillator system as claimed in claim 2, including a potentiometer for providing the tuning voltage.

4. An oscillator system as claimed in claim 3, in which the potentiometer is manually adjustable to vary the frequency of said output signal.

5. An oscillator system as claimed in claim 1 in which the deriving means comprises means for counting the cycles of said output signal in a predetermined period.

6. An oscillator system as in claim 1 in which said deriving means comprises a digital frequency meter having at least one digit for the lower part, and a digital-to-analogue converter connected to said meter and whose output provides said second input control voltage in response to the difference.

7. An oscillator system as in claim 6, in which said at least one digit can be any one of the ten integers between 0 and 9, and said difference is from a reference equal to one of the ten integers.

8. An oscillator system as in claim 1, in which the deriving means comprise a frequency counter connected to receive said output signal and arranged repeatedly to count for a predetermined period, a count at the end of said period being fed to a digital-to-analogue converter whose output provides said control voltage in response to the difference.

9. An oscillator system as claimed in claim 8, in which the predetermined period is determined by a gate period generator.

10. An oscillator system as claimed in claim 8, in which means are provided for varying the predetermined period.

11. An oscillator system as claimed in claim 9, in which the gate period generator comprises a divider chain with means for varying the effective length of the chain to vary the gate period.

12. An oscillator system as claimed in claim 8 including a latch in which the count is stored, and means for updating the latched count at the end of each gate period.

13. An oscillator system as is claim 8 in which the difference is from a reference equal to the least significant integer shown by the frequency counter.

14. An oscillator system as in claim 1, including an FM detector for receiving an input signal, said detector having a passband and providing an alternative control voltage dependent on the difference between the frequency of said input signal to the detector and the center frequency of the detector passband.

15. A radio receiver including a local oscillator, said local oscillator having an input for receiving an input voltage, the oscillator providing an output signal whose frequency is responsive to the input voltage, means for deriving from the output signal, the frequency of which is considered as represented in digital form, a control voltage dependent on the difference between only a lower part of the output signal and a predetermined lower part, said predetermined lower part comprising the lowermost digit represented by the output signal, said control voltage arranged for varying said input voltage, and means for varying the input voltage.

* * * * *